US008185081B2

(12) United States Patent
Russell et al.

(10) Patent No.: US 8,185,081 B2
(45) Date of Patent: May 22, 2012

(54) HIGH LINEARITY TUNABLE BANDPASS FILTER

(75) Inventors: John D. Russell, Rochester, NY (US); Thomas D. O'Brien, Honeoye Falls, NY (US)

(73) Assignee: Harris Corporation, Melbourne, FL (US)

( * ) Notice: Subject to any disclaimer, the term of this patent is extended or adjusted under 35 U.S.C. 154(b) by 418 days.

(21) Appl. No.: 12/507,465

(22) Filed: Jul. 22, 2009

(65) Prior Publication Data
US 2009/0275305 A1 Nov. 5, 2009

Related U.S. Application Data

(62) Division of application No. 12/424,710, filed on Apr. 16, 2009, which is a division of application No. 11/539,048, filed on Oct. 5, 2006, now Pat. No. 7,583,950.

(51) Int. Cl.
H04B 1/10 (2006.01)
H04B 1/18 (2006.01)

(52) U.S. Cl. .......... 455/307; 455/339; 455/290

(58) Field of Classification Search .......... 455/307, 455/339, 193.1, 197.3, 290; 333/205, 174
See application file for complete search history.

(56) References Cited

U.S. PATENT DOCUMENTS

| | | | |
|---|---|---|---|
| 4,905,306 A | 2/1990 | Anderson | |
| 4,965,853 A | 10/1990 | Barnard et al. | |
| 5,065,453 A | 11/1991 | Thomas | |
| 5,808,527 A | 9/1998 | De Los Santos | |
| 5,963,856 A | 10/1999 | Kim | |
| 6,064,866 A | 5/2000 | Lange et al. | |

(Continued)

FOREIGN PATENT DOCUMENTS

EP 0472319 2/1992

OTHER PUBLICATIONS

Peterson, D.A., "GaAs Insertion Enhances Sincgars RF Preselector" Tactical Communications Conference, 1992, vol. 1, Tactical Communications: Technology in Transition. Proceedings of the Fort Wayne, IN USA, Apr. 28-30, 1992, New York, NY USA, IEEE, US Apr. 28, 1992, pp. 133-137, XP010066443, ISBN: 978-0-7803-0745-2.

(Continued)

Primary Examiner — Sonny Trinh
(74) Attorney, Agent, or Firm — Fox Rothschild, LLP; Robert J. Sacco

(57) ABSTRACT

A tunable bandpass filter (10) is provided. An RF signal is provided at an input of the tunable bandpass filter, and a level shifted control signal (V1, V2) inputted to the tunable bandpass filter (10) switches a first arrangement and a second arrangement of one or more tuning portions (15, 17-1, 17-2, 17-3) in or out of the tunable bandpass filter using a GaAs FET switch. The first arrangement is coupled to the second arrangement using an inductor (13). An RF signal having a desired predetermined frequency at an output of the tunable bandpass filter (10) is produced by the switching. The tuning portions include the GaAs FET switch (15), a first capacitor (17-1) connected at a first signal terminal of the GaAs FET switch and a second capacitor (17-2) connected between a second signal terminal of the GaAs FET switch and ground. Each of the tuning portions can be arranged in parallel with one another.

4 Claims, 10 Drawing Sheets

U.S. PATENT DOCUMENTS

| | | | |
|---|---|---|---|
| 6,097,269 A * | 8/2000 | Hernandez | 333/174 |
| 6,218,972 B1 | 4/2001 | Groshong | |
| 6,553,216 B1 | 4/2003 | Pugel et al. | |
| 6,765,540 B2 | 7/2004 | Toncich | |
| 6,917,252 B1 | 7/2005 | Wyszynski | |
| 6,978,125 B2 | 12/2005 | Lindell et al. | |
| 7,116,954 B2 | 10/2006 | Toncich | |
| 7,148,770 B2 * | 12/2006 | Toncich | 333/205 |
| 7,174,147 B2 | 2/2007 | Toncich et al. | |
| 7,227,482 B2 * | 6/2007 | San et al. | 341/143 |
| 7,259,643 B2 * | 8/2007 | Son et al. | 333/174 |
| 7,583,950 B2 * | 9/2009 | Russell et al. | 455/339 |
| 7,649,407 B2 * | 1/2010 | Rohani et al. | 327/553 |
| 7,676,244 B2 | 3/2010 | Park et al. | |
| 8,107,917 B2 * | 1/2012 | Russell et al. | 455/290 |
| 2005/0184828 A1 | 8/2005 | Son et al. | |
| 2007/0018204 A1 * | 1/2007 | Kohama | 257/287 |
| 2008/0218273 A1 | 9/2008 | Uehara et al. | |
| 2009/0197561 A1 | 8/2009 | Russell et al. | |
| 2010/0295634 A1 * | 11/2010 | Akale | 333/205 |

OTHER PUBLICATIONS

Information about Related Patents and Patent Applications, see section 6 of the accompanying Information Disclosure Statement Letter, which concerns Related Patents and Patent Applications.

* cited by examiner

FIG. 4

TABLE 1

| PARAMETER | CONDITION | FREQUENCY | MIN. | TYP. | MAX. | UNIT |
|---|---|---|---|---|---|---|
| SWITCHING CHARACTERISTICS[1] | RISE, FALL (10/90% OR 90/10% RF) ON, OFF (50% CTL TO 90/10% RF) VIDEO FEEDTHRU | | | 10 20 25 | | ns ns mV |
| INPUT POWER FOR 1 dB COMPRESSION | 0/+3 V 0/+5 V | 0.5-3.0 GHz 0.5-3.0 GHz | | +30 +34 | | dBm dBm |
| INTERMODULATION INTERCEPT POINT (IP3) | FOR TWO-TONE INPUT POWER +5 dBm 0/+3 V 0/+5 V | 0.5-3.0 GHz 0.5-3.0 GHz | | +43 +50 | | dBm dBm |
| CONTROL VOLTAGES | $V_{LOW}$ = 0 TO 0.2 V @ 20 μA MAX $V_{HIGH}$ = +3 V @ 100 μA MAX TO +5 V @ 200 μA MAX | | | | | |

1. VIDEO FEEDTHRU MEASURED WITH 1 ns RISETIME PULSE AND 500 MHz BANDWIDTH.

TABLE 2

| PARAMETER | FREQUENCY | MIN. | TYP. | MAX. | UNIT |
|---|---|---|---|---|---|
| INSERTION LOSS | 0.1-1.0 GHz 1.0-2.0 GHz 2.0-3.0 GHz 3.0-4.0 GHz | | 0.3 0.4 0.5 0.6 | 0.5 0.6 0.7 0.8 | dB dB dB dB |
| ISOLATION | 0.1-1.0 GHz 1.0-2.0 GHz 2.0-3.0 GHz 3.0-4.0 GHz | 22 20 20 23 | 25 22 23 26 | | dB dB dB dB |
| VSWR | DC-4.0 GHz | | 1.2:1 | 1.3:1 | |

FIG. 10

| TOPOLOGY | LINEARITY | SIZE | POWER | SELECTIVITY |
|---|---|---|---|---|
| VARACTOR TUNED | POOR | MEDIUM | LOW | GOOD |
| PIN DIODE TUNED | EXCELLENT | LARGE | MEDIUM | EXCELLENT |
| GaAs FET TUNED | EXCELLENT | SMALL | LOW | GOOD |

HIGH LINEARITY TUNABLE BANDPASS FILTER

CROSS REFERENCE TO RELATED APPLICATIONS

This application is a divisional of co-pending U.S. patent application Ser. No. 12/424,710, filed on Apr. 16, 2009, which is a divisional of co-pending U.S. patent application Ser. No. 11/539,048 filed Oct. 5, 2006.

BACKGROUND OF THE INVENTION

1. Statement of the Technical Field

The inventive arrangements relate generally to bandpass filters, and more particularly to a tunable bandpass filter and a method of tuning a bandpass filter.

2. Description of the Related Art

The designation "legacy" is often used to refer to manpack radios that were used by tactical forces during the decades which preceded and overlapped with the so called digital era. Overall performance of legacy radios was considered to be more than adequate, and is often used to judge the performance of similar communication devices used today. The good performance of legacy radios is in part due to the fact that they used waveforms with simple modulation schemes and narrow frequency coverage.

The comparatively simpler modulation schemes and limited frequency coverage of legacy radios lend themselves to transmit paths with very good transmit noise floor and transmit spurious performance in a small form factor with low power consumption. As an example of simple modulation schemes and narrow frequency coverage, some legacy radios may use FSK modulation with a frequency coverage of only 30-88 MHz.

In today's tactical environment however, manpack and handheld radios are required to operate in a congested frequency spectrum. Further, newer, multi-band, multi-mode SDR radios (software defined radios) require complex modulation schemes and broad frequency coverage. Modulation schemes such as QAM (quadrature amplitude modulation) require superior transmit linearity. Further, wider frequency coverage, for example, from 30-512 MHz, requires multiple bands of filtering. This requirement is at odds with requirements such as lower power consumption in a small form factor with high linearity.

It is a continuing challenge is to design a tunable bandpass filter to provide broadbanded and highly selective transmit filtering in a small form factor with minimal power consumption (legacy performance). Some "legacy" collocation specifications included transmit noise floor (−170 dBc/Hz), and transmit spurious (−80 dBc). These specifications (along with others) may be used to define "legacy performance". To meet these specifications, selective filtering is required as close to the antenna as possible, i.e. selective filtering at the highest power level possible. However, legacy waveforms typically do not require high linearity transmit paths, that is, good IMD (intermodulation distortion) performance. This somewhat eases the linearity requirements of the filter. In contrast, newer high data rate/narrow bandwidth waveforms require a highly linear transmit path.

As one possible answer to the challenge, varactor tuned bandpass filters may be considered. However, varactor tuned bandpass filters have poor linearity, thus limiting their input power levels, and thereby reducing their filtering effectiveness from a transmit noise floor perspective. Linearity of the filter (intermodulation distortion) and tuning voltage are limited by the maximum voltage rating of the varactor diodes themselves.

Key factors for a tunable filter implemented with varactor diodes are the varactor tune voltage and the RF signal voltage. In a varactor tuned bandpass filter, as the RF signal voltage becomes significant compared to the varactor tune voltage, distortion increases dramatically. The varactor tune voltage is limited by the tuning capacitance change required (filter frequency coverage), and the maximum reverse voltage of the varactor diode (typically 25 VDC or less).

In one particular investigation, linearity measurements from prototypes of a varactor tuned bandpass filter were determined through standard measurements of intermodulation distortion. With −2.5 dBm PEP RF (peak envelope power radio frequency) signal input, the IMD products were 44.8 dB down. Given an insertion loss of −4.5 dB for the filter, the output intercept point (OIP) was +9.4 dBm.

As another possible approach to designing a software defined radio to meet legacy specifications, it has been suggested that linearity may be improved using a PIN diode switched bandpass filter. However, with a PIN diode switched bandpass filter, power consumption would be unacceptable in that the filter would require significant DC biasing circuitry and size. Without building a prototype, investigations suggested that a 20 dBm PEP RF signal input (100 mW) would have a +50 dBm output intercept point (OIP3). The power consumption of the filter would be approximately 350 mW given 10 mA PIN diode forward bias on 10 separate PIN diodes. This does not include the power required for diode switching circuitry. A PIN diode switched bandpass filter is impractical with respect to legacy specifications, at least because it does not meet the low power consumption requirement.

An objective of the invention is to provide a tunable bandpass filter having broadbanded waveforms with low distortion (high linearity) in the transmit path. A further objective of the invention is to provide a tunable bandpass filter having highly selective transmit filtering. Another objective of the invention is to provide a tunable bandpass filter having good collocation performance. A further objective of the invention is to provide a tunable bandpass filter having a small size. A further objective of the invention is to provide a tunable bandpass filter having low power consumption. A further object of the invention is to provide a software defined radio having legacy performance.

SUMMARY OF THE INVENTION

The invention concerns using gallium arsenide field effect transistor switches and discrete capacitors to create tunable elements in a tunable bandpass filter for a software defined radio.

According to the invention, a tuning portion for tuning a circuit includes a switch that is implemented with one or more gallium arsenide field effect transistors (GaAs FET switch), a control terminal to receive a control signal to turn the GaAs FET switch on or off, a first capacitor connected at a first signal terminal of the GaAs FET switch, and a second capacitor connected between a second signal terminal of the GaAs FET switch and ground.

In a preferred arrangement, the control signal is a digital signal, the digital signal can be level shifted, and the tuning portion can further include a termination capacitor for the GaAs FET switch when it is turned off.

According to another aspect of the invention, there is provided a software defined radio having one or more tunable bandpass filter circuits which include an impedance step-up element at an input of the one or more tunable bandpass filter circuits, an impedance step-down element at an output of the one or more tunable bandpass filter circuits, and one or more tuning portions. Each tuning portion can include at least one component selected from among a capacitive component, a resistive component and an inductive component and at least one switching element to switch one or more components in and out of the one or more tunable bandpass filter circuits, and a control terminal to receive at least one input signal to turn one or more switching elements on or off.

In a preferred arrangement, the impedance step-up element is an autotransformer and the impedance step-down element is an autotransformer, the switching element is a GaAs FET switch, one component is a capacitor connected at a first signal terminal of the gallium arsenide transistor and another component is a capacitor connected between a second signal terminal of the GaAs FET switch and ground. The one or more tunable bandpass filter circuits can include a termination capacitor for the GaAs FET switch when it is turned off. An input signal may be a digital signal, the digital signal may be level shifted, voltage levels of the digital signal may range from LVCMOS (low voltage complementary metal oxide semiconductor) levels on a low end and up to and including a level of 8 volts on an upper end, and the software defined radio may be selected from among a handheld radio and a manpack radio, and can have a frequency coverage of 30-512 MHz.

According to another aspect of the invention, there is provided a tunable bandpass filter which includes an autotransformer to provide impedance step-up at an input of the tunable bandpass filter, an autotransformer to provide impedance step-down at an output of the tunable bandpass filter, and two or more tuning portions arranged in parallel with one another. Each tuning portion includes two or more tuning elements and at least one GaAs FET switch to switch the two or more tuning elements in and out of the tunable bandpass filter. At least one inductive element may couple the tuning portions together, and at least one control terminal may receive a control signal to turn the GaAs FET switch on or off.

In a preferred arrangement, two or more tuning elements are capacitors, one of the tuning elements is connected at a first signal terminal of the GaAs FET switch, and one of the tuning elements is connected between a second signal terminal of the GaAs FET switch and ground. The tunable bandpass filter can be included in a software defined radio selected from among a handheld radio and a manpack radio.

According to another aspect of the invention, there is provided a method of operating a tunable bandpass filter. An RF signal is provided at an input of the tunable bandpass filter, and a level shifted control signal can be inputted to the tunable bandpass filter to perform switching of a first arrangement and a second arrangement of one or more tuning portions in or out of the tunable bandpass filter using a GaAs FET switch. The first arrangement can be coupled to the second arrangement using an inductor. An RF signal having a desired predetermined frequency and bandwidth at an output of the tunable bandpass filter can be produced by the switching.

In a preferred arrangement, each of the tuning portions includes the GaAs FET switch, a first capacitor connected at a first signal terminal of the gallium arsenide transistor and a second capacitor connected between a second signal terminal of the GaAs FET switch and ground. Each of the tuning portions can be arranged in parallel with one another. A value of the first capacitor and a value of the second capacitor may be chosen to produce the RF signal of the desired predetermined frequency and bandwidth at the output of the tunable bandpass filter. Multiple bands of filtering having frequency coverage from 30-512 MHz can be produced by the switching. The multiple bands may include a 30-57 MHz band, a 57-108 MHz band, a 108-160.7 MHz band, a 160.7-304.8 MHz band and a 304.8-512 MHz band. The method of operating may be used in a software defined radio selected from among a handheld radio and a manpack radio.

The foregoing and other objects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference must be made to the claims herein for interpreting the scope of the invention.

BRIEF DESCRIPTION OF THE DRAWINGS

FIG. 4 shows tables listing some of the specifications of the switch of FIG. 3

FIG. 10 is a table listing some comparisons between features of a GaAs FET tuned filter, a varactor tuned filter and a PIN diode tuned filter.

DETAILED DESCRIPTION

Figure 1:
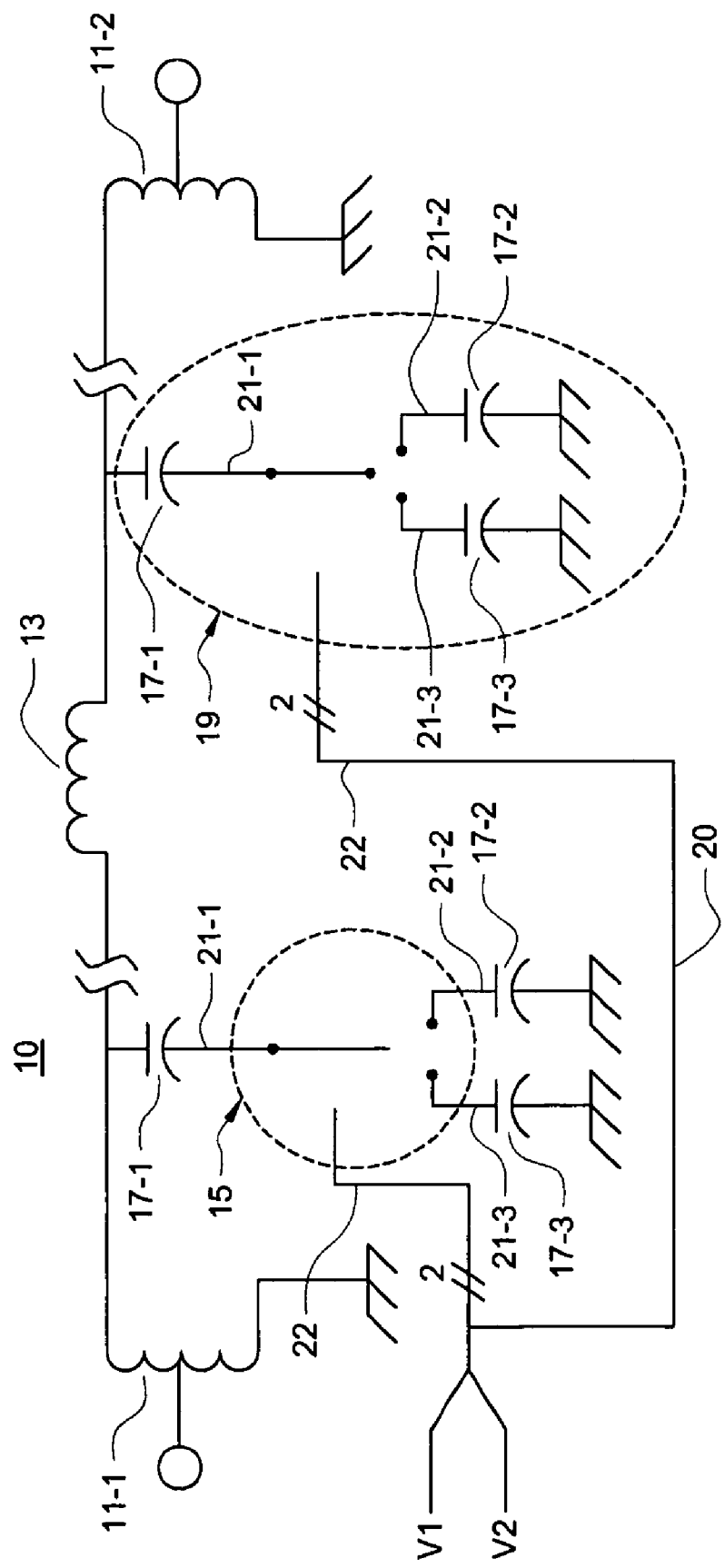
FIG. 1 is a diagram illustrating an embodiment of the invention.

An exemplary embodiment of the invention is shown in FIG. 1. For the exemplary embodiments shown in FIGS. 1, 6 and 7, like numerals are used to designate like elements unless otherwise indicated.

In the example of FIG. 1, reference numeral 11-1 designates an impedance changing element at an input of a tunable bandpass filter 10, and reference numeral 11-2 designates an impedance changing element at an output of the tunable bandpass filter 10. In the example shown, the impedance changing elements 11-1 and 11-2 are autotransformers. An autotransformer is special type of transformer consisting of a single, continuous winding that is tapped on one side to provide either a step-up or step-down function.

Figure 6:
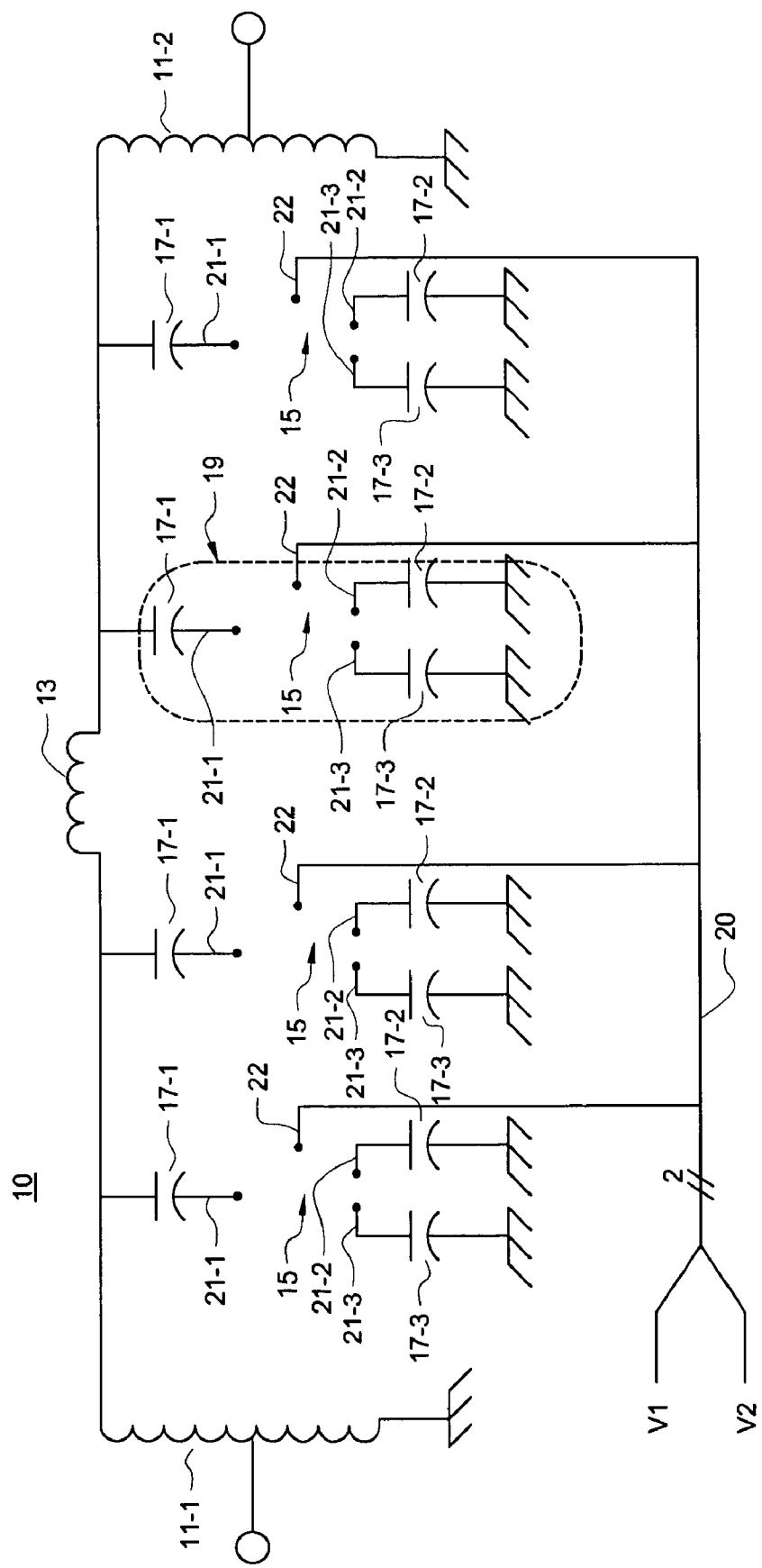
FIG. 6 is a diagram illustrating an embodiment of the invention in which two tuned circuits have two switch legs each.
Figure 7:
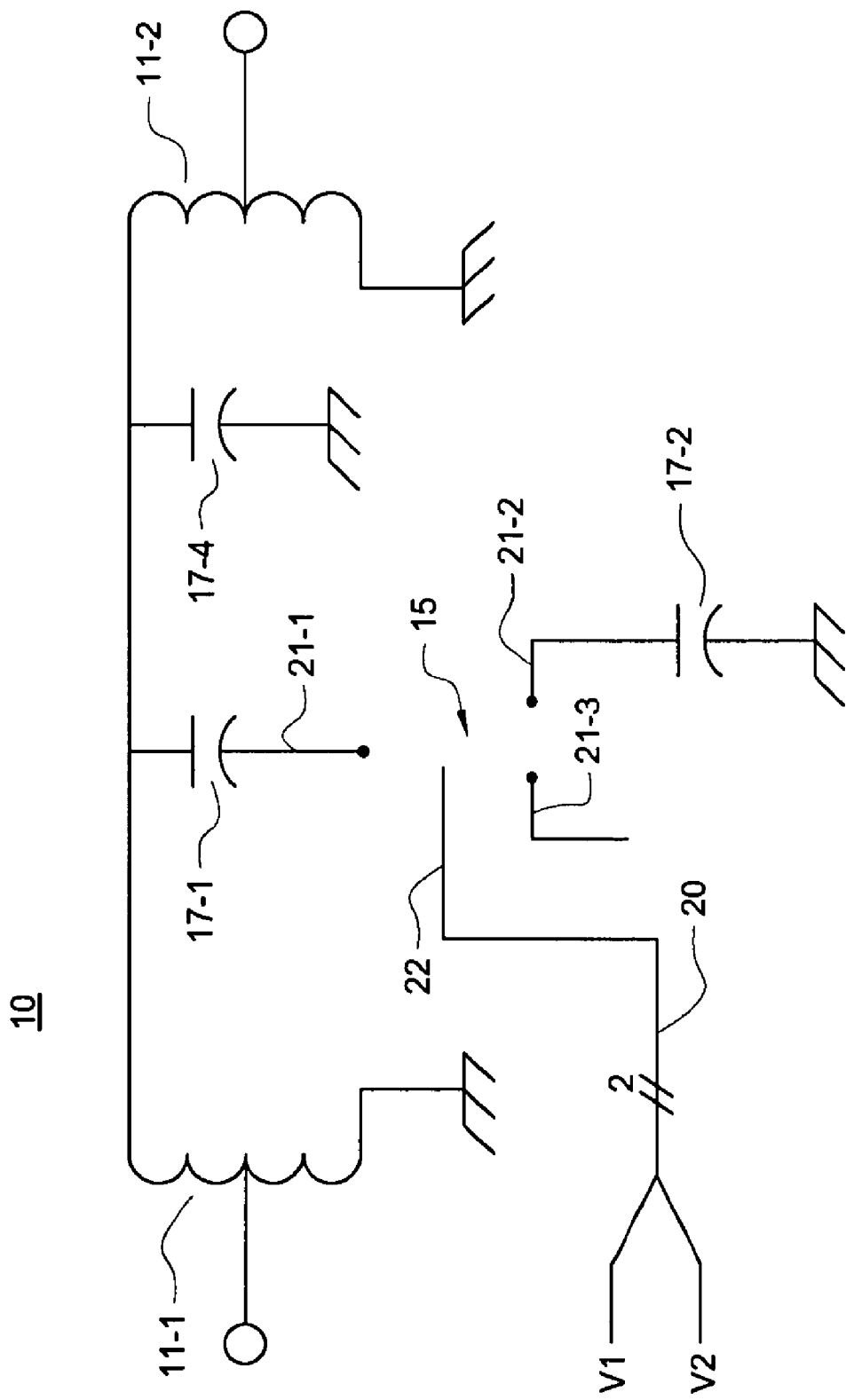
FIG. 7 is a diagram illustrating an embodiment of the invention using a small number of components.

While autotransformers are shown in the examples of FIGS. 1, 6 and 7, almost any type of transformer would be adequate in any one of the filter topologies to be discussed, a main goal being to step up or step down the impedance at an input and output of the tunable bandpass filter 10. A purpose of impedance "transformation" is to optimize selectivity in any of the filter topologies here discussed (better selectivity comes with higher input impedance). At the input of the tunable bandpass filter 10, the autotransformer 11-1 is an impedance step-up element. At the output of the tunable bandpass filter 10, the autotransformer 11-2 is an impedance step-down element. Such is the case in each of the embodiments shown in FIGS. 1, 6 and 7.

Figure 2:
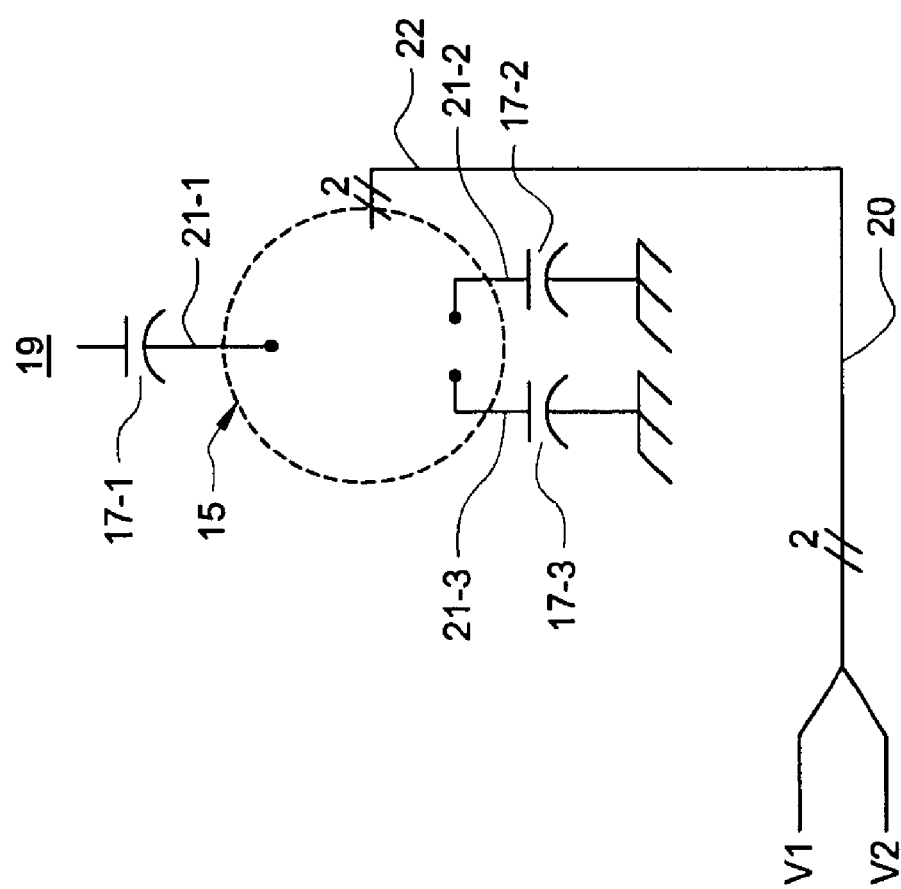
FIG. 2 is diagram showing a single switch leg of the invention.

In the example of FIG. 1, an inductive element (inductor 13) couples together tunable circuits of the tunable bandpass filter 10 (such coupling is common practice, as those skilled in the art will appreciate). The designation "tunable circuit", in the example shown in FIG. 1, is used to refer to the circuitry on either side of the inductor 13 (the inductor 13 divides the filter into two tunable circuits). A tunable circuit is also herein referred to as a resonator. A tunable circuit (also tuning or tunable portion) can have one or more "switch legs". A single switch leg, designated by reference numeral 19, is shown in FIG. 2, for example.

Referring to FIG. 1, a switch leg 19 includes the GaAs FET switch 15 (inside of the dashed circle) having signal terminals 21-1, 21-2, 21-3. Capacitors 17-1, 17-2 and 17-3 are respectively connected to signal terminals 21-1, 21-2, 21-3. The dashed circle is placed around the GaAs FET switch 15 for identification purposes only, and is not part of the schematic symbol. The dashed circle is not again used to identify each GaAs FET switch 15.

Notably, the schematic symbol used to represent the GaAs FET switch in FIGS. 1-3 and 5-7 shows a plurality of signal terminals 21-1, 21-2, 21-3 and a single control terminal 22. A more detailed illustration is provided in FIG. 3, and shows the FET switch control terminal can actually include two separate electrical connections 21-1, 21-2 for receiving control voltages V1 and V2 via a line 20. In this regard, it should be understood that the line 20 used for controlling the switch is actually comprised of at least two separate conductive paths. In some of the figures, portions of line 20 appear as a single line for ease and simplicity of illustration. However, in the embodiments shown and discussed herein, line 20 should be understood as having at least two separate conductive paths. In FIGS. 1-3, and 5-7, the hash mark across the line 20 and the numeral 2 above the hash mark is used to illustrate that the line 20 has two conductive paths.

As will be appreciated from the ongoing discussion, there are several considerations for arranging the capacitors in the manner shown in the example of FIG. 1 (see also FIG. 6). As a base consideration, the arrangement of the capacitors is consistent with an indication from the data sheet that the GaAs FET switch should have DC blocking capacitors at the signal terminals thereof. For the embodiments shown, a Skyworks AS-211-334 GaAs FET can be used. A complete data sheet for the GaAs FET is not provided. However, the data sheet is incorporated herein in its entirety by reference thereto (some relevant specifications are provided in tables 1 and 2 of FIG. 4).

The AS-211-334 switch specifications further indicate that the blocking capacitors must be supplied externally (external to the GaAs FET switch). Accordingly, while the primary consideration for capacitors 17-1 and 17-2 is their use as tuning capacitors, capacitors 17-1, 17-2 and 17-3 provided at signal terminals 21-1, 21-2, 21-3 of the GaAs FET switch 15 of FIG. 1 may also serve as blocking capacitors. Capacitor 17-3, which also serves as a termination capacitor for the GaAs FET switch 15, typically has a very small value in comparison to a value of capacitor 17-1. Capacitor 17-3 may be optional under some circumstances. For example, for minimum component count, stray capacitance in the filter may suffice to replace capacitor 17-3. Stray capacitance may be defined as capacitance sometimes created by the proximity of other circuit components to each other (it is generally unwanted). Ideally, stray capacitance should not be present. However, it often is present in some small amount, and in some instances can be a suitable substitute for capacitor 17-3.

Preferably, both tuning capacitors 17-1 and 17-2 are required. A preferred arrangement of capacitors 17-1 and 17-2 is such that the capacitors 17-1 and 17-2 are connected to signal terminals 21-1 and 21-2 of the GaAs FET switch 15 respectively. This capacitor arrangement provides an added degree of tuning flexibility for the tunable bandpass filter 10.

For example, when the GaAs FET switch 15 is ON, a low resistance conductive path is provided between signal terminals 21-1, 21-2 of the GaAs FET switch. Accordingly, capacitors 17-1, 17-2 are switched into the tunable bandpass filter 10 in a series arrangement. The series arrangement produces a capacitor value lower than a value of either of the individual capacitors. For calculations sake, it is well known by practitioners that a total capacitance value of two series capacitors is calculated in the same manner as resistors in parallel (product of the two capacitors divided by the sum of the two capacitors).

On the other hand, when the GaAs FET switch 15 is OFF, a low resistance conductive path is provided between the signal terminals 21-1 and 21-3. Accordingly, the capacitors 17-1 and 17-3 are switched into the tunable bandpass filter. Under these circumstances, the total capacitance of the switch leg is the series combination of capacitors 17-1 and 17-3. When capacitor 17-1 is chosen to be much larger than capacitor 17-3 (or capacitor 17-3 is chosen to be much smaller than capacitor 17-1), the effect of turning the GaAs FET switch OFF is to switch an entire switch leg 19 out of the filter. In such a case, the capacitance of the series combination of capacitors 17-1 and 17-3 is generally no greater than a small amount of stray capacitance in the filter, and is not expected to provide any contribution to the tuning of the filter. It is quite conceivable that such a contribution is possible if a value of capacitor 17-3 is chosen to be larger. Typically however, an entire leg is switched out of the filter 10 when the GaAs FET switch 15 is turned OFF.

By choosing similar values for 17-1 and 17-2 (values larger than capacitor 17-3), the effect of termination capacitor 17-3 upon the bandpass filter can be minimized. Alternatively, capacitor 17-1 can be chosen to be a large value that is insignificant to the total ON capacitance (a large value capacitor 17-1 will look like no capacitor when switched into series with capacitor 17-2). In such a case, the total ON capacitance would be approximately that of capacitor 17-2 only. Such an arrangement adds to the tuning flexibility of the filter (the tuning operation will be explained later).

The circuit of FIG. 1 shows broken line and ellipses. These are intended to indicate that each tuning portion (resonator) of the tunable bandpass filter 10 can include additional switch legs 19. The addition of more switch legs 19 provides added tuning flexibility to the filter by increasing a number of switching combinations (this will be explained later).

In the example of FIG. 1, the tunable circuit to the left of the inductor 13 can be constructed of a switch formed of one or more GaAs FETs (GaAs FET switch) 15 and tuning elements 17-1 and 17-2. In the example shown, a capacitor 17-1 is connected at a signal terminal 21-1 of the GaAs FET switch 15, and a second capacitor 17-2 is connected between signal terminal 21-2 of the GaAs FET 15 switch and ground. The tuning portion includes termination capacitor 17-3 connected between the signal terminal 21-3 of the GaAs FET switch 15 and ground. A second tuning portion, to the right of inductor 13, is similarly arranged. It is common practice among skilled practitioners to arrange the second tuning portion so that it mirrors the tuning portion to the left of the inductor 13 (first tuning portion). In each of FIGS. 1, 6 and 7, reference numeral 20 designates a line having two conductive paths for inputting control signals (V1 and V2) to turn the GaAs FET switch 15 ON or OFF.

As previously mentioned, FIG. 2 provides an illustration of an example of a single switch leg 19. A switch leg 19 may have only one capacitor (for example, capacitor 17-2) and the GaAs FET switch 15. It is a preferable to have the GaAs FET switch AC coupled on each signal terminal 21-1, 21-2, 21-3 (DC blocking capacitors on each node). However, because there is a low probability that DC current will get into the GaAs FET switch, and because stray capacitance is expected to be present in the circuit board surrounding the GaAs FET switch in a small amount, capacitor 17-3 may be eliminated for an absolute minimum component count. The filter can operate satisfactorily with a minimum component count, but with some limitations with respect to bandwidth and number of center frequencies.

Figure 3:
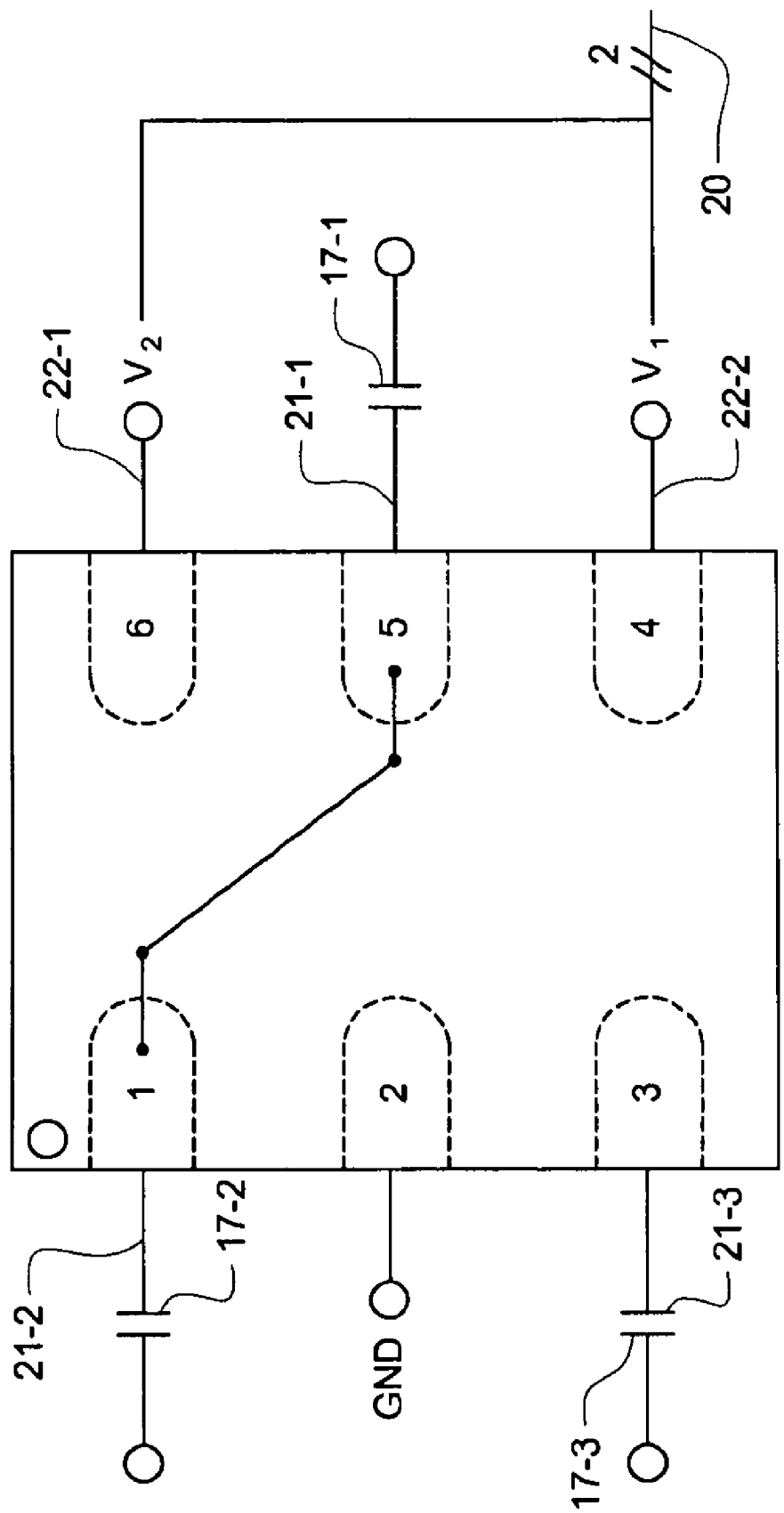
FIG. 3 shows a drawing of an example of a switch which can be used to implement the invention.

FIG. 3 provides a diagram of the AS-211-334 GaAs FET switch (previously mentioned), which can be used in implementing the invention. As shown in FIG. 3, when the switch is in the ON position, signal terminals 21-1 and 21-2 are connected in series. In a preferred arrangement, capacitors 17-1 and 17-2 are connected at 21-1 and 21-2 respectively. Control voltages to the switch are input at V1(ON) and V2(OFF) via line 20. Capacitor 17-3 (when used) is connected at 21-3.

FIG. 4 provides some relevant specifications for the GaAs FET switch AS-211-334. Information provided in Tables 1 and 2 of FIG. 4 is not intended to be limiting.

Figure 5:
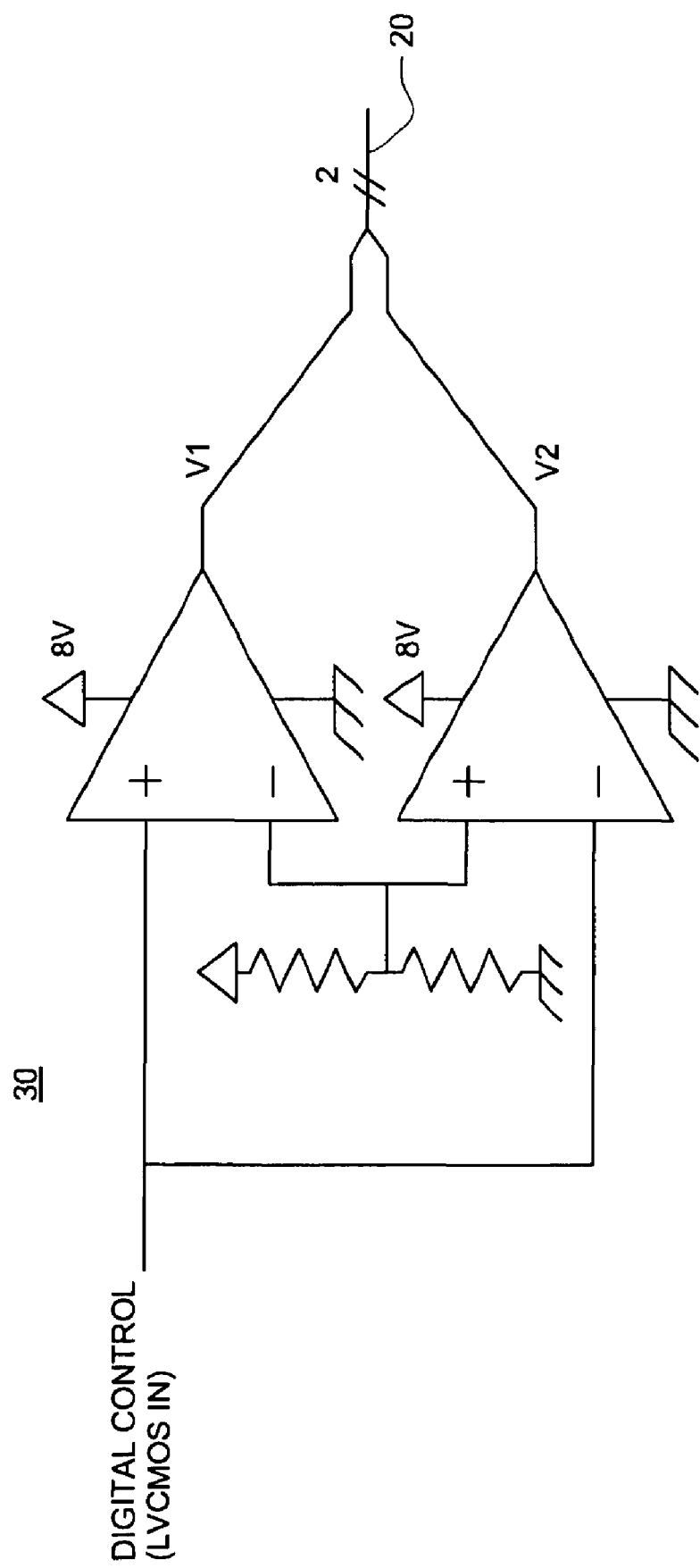
FIG. 5 shows an example of a circuit to provide control signals for switching the switch of FIG. 3.

FIG. 5 shows an example of a level shifting circuit 30 for providing control signals to the GaAs FET switch 15 to switch it ON or OFF. In the example shown, level shifting circuit 30 is comprised of a pair of comparators. In the circuit shown, each comparator is a commercially available LMV7211 type comparator. The data sheet for the LMV7211 comparator is incorporated herein by reference, but the specifications therein are not intended to be limiting.

It is here noted that the data sheet for the AS-211-334 GaAs FET switch specifies that the maximum control voltage $V_{High}$ is +5 volts. Level shifting circuit 30, however, provides a control voltage $V_{High}$ of up to +8 volts to the switch. However, when the GaAS FET switch is used in the manner in which it is used in this particular invention, the increase in control voltage provided by the level shifter has no deleterious effect on the operation of either the filter, or on the GaAs FET switch itself. Rather, for this particular design, the increase in voltage increases linearity of the switch.

By way of explanation, a simple (single) comparator, in general, has a plus (non-inverting) and minus (inverting) input, wherein a signal (capable of being varied) is received at one of the inputs while the other input is fixed at a reference or threshold voltage level. In a simple comparator operation, the input signal is compared to the reference voltage, and an output signal is based on the comparison (for example, the larger of the input signal and reference signal is output). The comparator can be configured so that the signal at the output of the comparator will be low on one hand, or high (up to the supply voltage) on the other hand. The switching back and forth between two output voltage levels normally occurs when the input signal crosses a threshold voltage. Such a simple comparator provides a single high or low output, and therefore is not suitable for simultaneously providing a signal and its complement in the manner required for implementing the invention.

By contrast, a comparator, such as the comparator of FIG. 5, provides two outputs (for example, V1 and V2). In the arrangement shown, these output signals are complements of each other. As shown in FIG. 5, an inverting and a non-inverting input of the respective comparators are connected. In this configuration, when a (high) input signal is received, and V1 goes high, V2 goes low. The output signals change (switch) when the input voltage crosses a reference voltage level. For example, when a (low) signal is input to the comparator, and V1 goes low, V2 goes high. As a more particular example, when a high signal (3 volts, for example) is received at the input of the comparator, V1 goes to 8 volts while V2 goes to 0 volts. When a low signal (0 volts, for example), V1 goes to about 0 volts and V2 goes to 8 volts. For all practical purposes, the switching is instantaneous.

In the example of FIG. 5, the input signals to the comparator are single digital control signals from LVCMOS circuits, which will be discussed later.

FIG. 6 illustrates an example of another embodiment of the invention. In the example of FIG. 6, the tunable bandpass filter 10 has two tunable circuits coupled together by the inductor 13. Each tunable circuit has two switch legs 19. In this embodiment, there are two tuning capacitors 17-1 and 17-2 on each switch leg 19 of the tunable bandpass filter 10. Termination capacitor 17-3 is also included.

In the example of FIG. 6, four switch combinations are possible with regard to the two switch legs 19 in the first tuning portion (left of the inductor 13). In particular, (1) both switch legs 19 can be ON, (2) both switch legs 19 can be OFF, (3) the first switch leg 19 can be ON and the second switch leg 19 can be OFF and (4) the first switch leg 19 can be OFF and the second switch leg 19 can be ON. This arrangement adds even more flexibility to the tunable bandpass filter 10. As previously alluded to, common practice is that the first tuning circuit mirrors the second tuning circuit, so during a tuning operation, the same ON/OFF combinations used in the first tuning circuit should be used in the second tuning circuit. However, it should be understood that the invention is not limited in this regard.

FIG. 7 illustrates an example of another embodiment of the invention. Particularly, FIG. 7 shows a tunable bandpass filter 10 implemented with a lower component count. While tuning capacitors 17-1 and 17-2 are shown, an absolutely minimum component count can include the GaAs FET switch 15 and only one other component, for example, a resistor or an inductor in place of capacitor 17-2 (in such a case, capacitor 17-1 is excluded).

In the example of FIG. 7, however, tuning capacitors 17-1 and 17-2 are shown. Further, it should be understood that the designation of capacitor 17-4 is not representative of a real capacitor. Rather, the representation is here added to merely indicate the presence of stray capacitance in the circuit by way of illustration. Ideally, stray capacitance would not be present in the circuit. Otherwise, capacitor 17-4 may be excluded.

In the exemplary arrangement of FIG. 7, the ON position of the GaAs FET switch 15 connects capacitors 17-1 and 17-2 in series for the total capacitance of the switch leg 19. In the OFF position, capacitor 17-1 is not connected to anything (since the termination capacitor is excluded) and ideally would not contribute to the total capacitance of the switch leg 19. In the example shown, capacitor 17-1 can be chosen to have an extremely large value so that the circuit would effectively see only capacitor 17-2.

The example of FIG. 7 is intended to show that the design can be implemented by simply switching a component or a minimum number of components (regardless of the type of component) in or out of the tunable bandpass filter 10 to alter the frequency response of the tunable bandpass filter 10.

Figure 8:
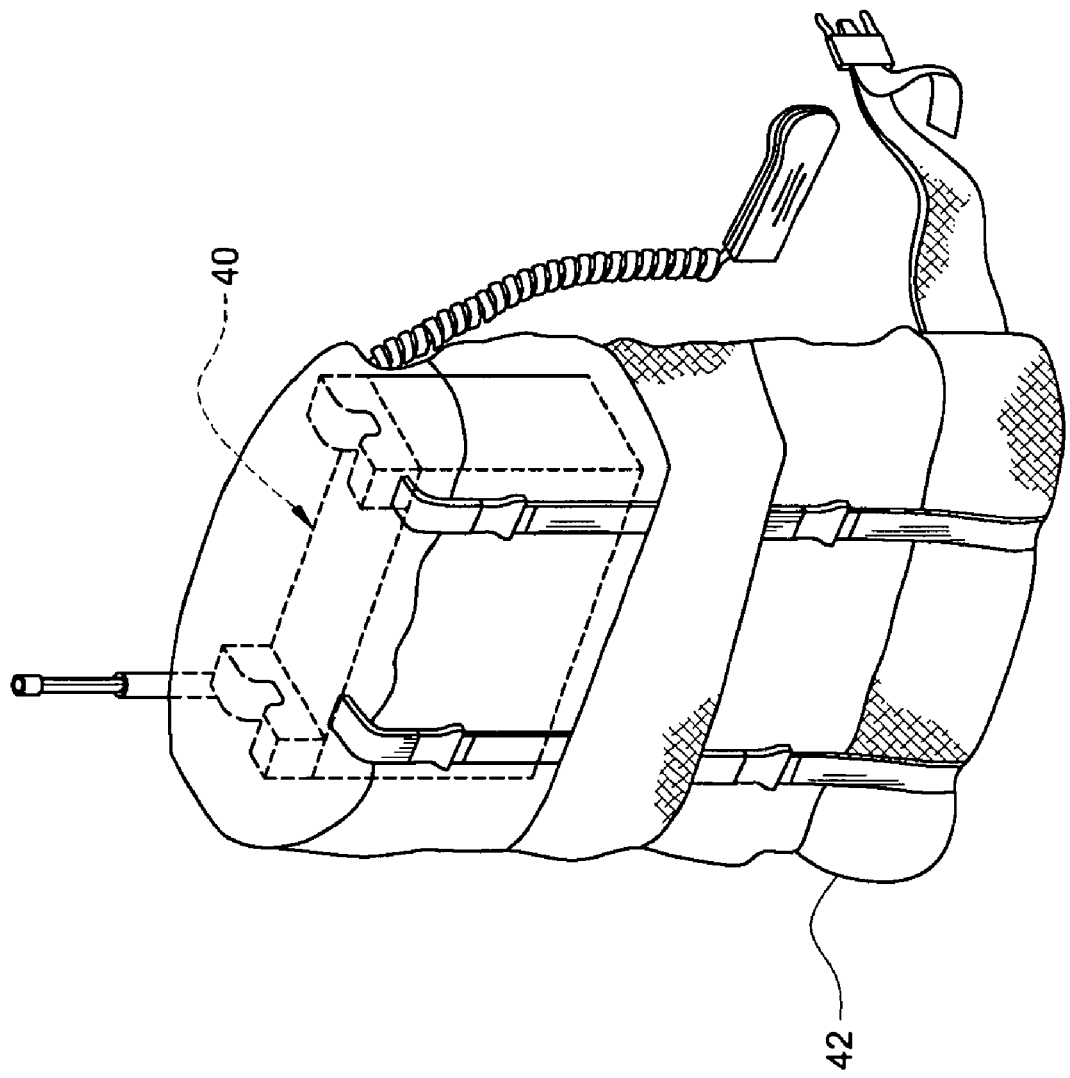
FIG. 8 is an illustration of an example of a manpack radio.

FIG. 8 shows an example of manpack radio 40 (in ghost), in which the tunable bandpass filter 10 can be implemented. An exemplary field pack for carrying the manpack radio 40 is designated by reference numeral 42. The example shown is for illustration purposes only, and is not intended to be limiting. The tunable bandpass filter 10 can also be implemented in a handheld radio, a phone, etc. However, the tunable bandpass filter 10 is not limited to use in mobile communication devices.

Figure 9:
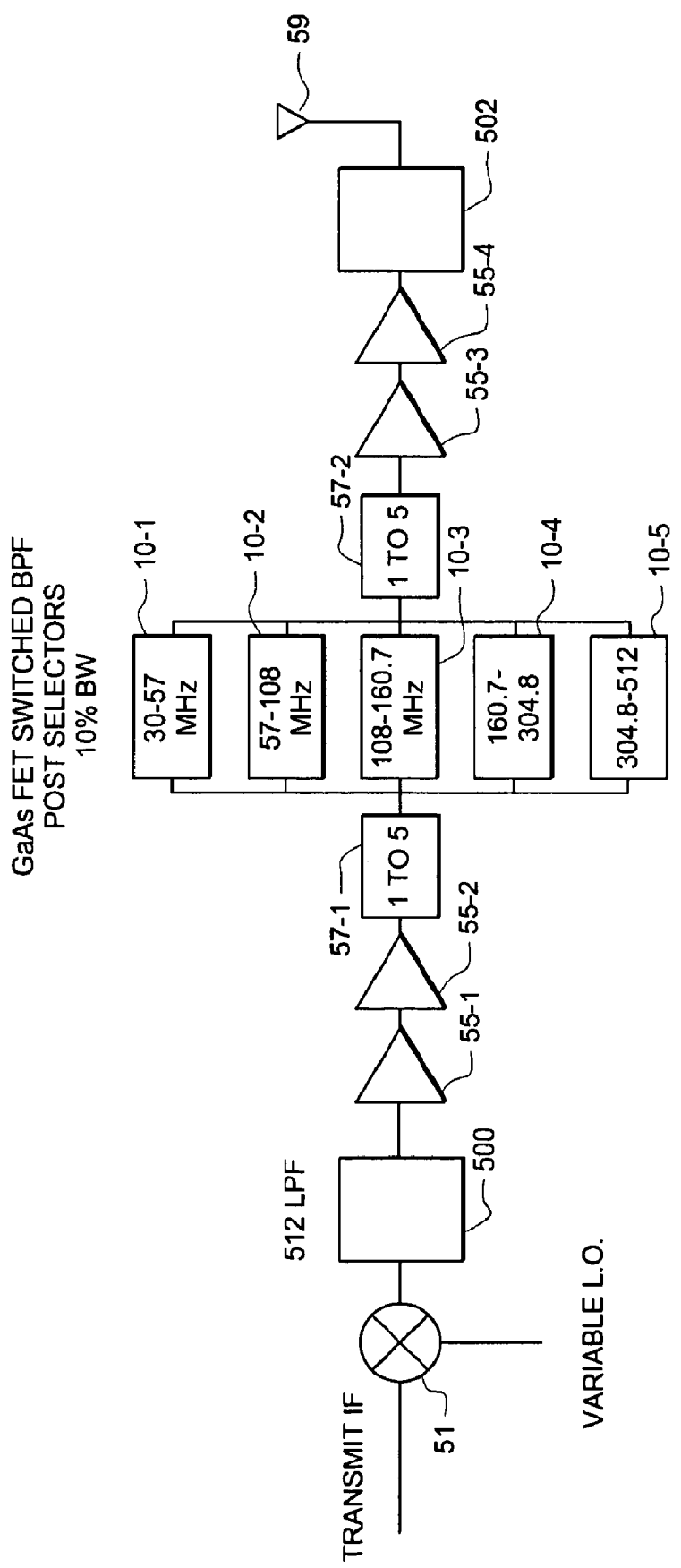
FIG. 9 shows a block diagram of a system in which the invention can be implemented.

A block diagram of a system in which the invention can be implemented is shown in FIG. 9. As shown in FIG. 9, a mixer 51 receives a modulated transmit IF (intermediate frequency) signal and a variable local oscillator signal. The mixed signal is output to low pass filter (LPF) 500 where unwanted frequencies are attenuated (the filter passes a desired range of low frequencies). The output of LPF 500 is amplified through amplifier stages 55-1 and 55-2 and input to switch 57-1. Switch 57-1 is used as a 1 to 5 way switch to select the appropriate bandpass filter 10 (10-1 thru 10-5) to be tuned to the desired frequency. Bandpass filter 10 is actually 5 bandpass filters, each having a configuration of the bandpass filter 10 of FIG. 1, for example.

As shown in the example of FIG. 9, frequency coverage for the tunable bandpass filter 10 includes frequencies from 30-512 MHz using multiple bands of filters 10. The multiple bands include a 30-57 MHz band, a 57-108 MHz band, a 108-160.7 MHz band, a 160.7-304.8 MHz band and a 304.8-512 MHz band (this example is not intended to be limiting).

After tuning the selected filter 10 to pass the desired frequency, switch 57-2 (also a 1 to 5 way switch) passes the output of the selected tuned filter to amplifier stages 55-3 and 55-4 for amplification. Filter 502 filters out unwanted harmonics from the signal and passes it to antenna 59 which transmits the signal at the selected frequency.

An operation of the tunable bandpass filter 10 will now be explained.

Referring again to the block diagram of FIG. 9, an IF signal is received, mixed and amplified in the manner previously described. Controllers in an SDR (not shown) output signals to 1 to 5 way switches 57-1 and 57-2 to select the appropriate tunable bandpass filter 10 tuned to pass a desired frequency band. The signal from the amplifier stages is input to the selected filter at autotransformer 11-1, which resonates with any capacitors currently switched into the filter. Based on switched combinations (which switch legs 19 are ON or OFF), a signal having a desired frequency range is output at autotransformer 11-2 of the tunable bandpass filter 10.

To tune the filter to a different frequency, tune settings are recalled from a memory (for example, a ROM) and ON/OFF control signals V1 and V2 are output via the separate conductive paths of line 20 to again turn the appropriate GaAs FET switches 15 ON or OFF. The ON/OFF switching action switches the appropriate switch legs 19 in or out of the selected tunable bandpass filter 10. As a result, the tuning capacitors switched into the tunable bandpass filter 10 resonate with the autotransformers 11-1, 11-2 to produce the new center frequency. The center frequency (resonant frequency) may be defined as the geometric mean between the lower cutoff frequency and the upper cutoff frequency of the frequency band of interest.

Each tunable bandpass filter 10 typically has different values of capacitors. For example, the tunable bandpass filter 10-1 (30-57 MHz) typically has different value capacitors than filter 10-3 (304.8-512 MHz). Center frequencies and bandwidths for each band are determined by the combinations of legs switched either ON or OFF. The number of combinations is determined by $2^n$, where n is the number of switch legs. For example, a filter having 6 switch legs would have $2^6$ (64) possible combinations which may be used to produce desired center frequencies and bandwidths. A filter having one switch leg would have only two combinations, but would nevertheless produce a frequency and bandwidth associated with the capacitor values chosen for the switch legs. In other words, the filter is fully functional with only two switch legs total, but may be limited with respect to bandwidth and number of center frequencies.

Frequency responses for each switch combination are determined during the design phase, and the combinations which produce each frequency stored in a memory for recall. Each filter has its own unique set of stored combinations.

Referring again to FIG. 9, at the output of the tunable bandpass filter 10 (autotransformer 11-2), the signal at the new frequency is amplified and filtered (in filter 502), and then transmitted via antenna 59.

In the tuning operation described above, level shifting circuit 30 provides control signals V1 and V2 via line 20 to turn GaAs FET switches 15 on or off to switch tuning portions in or out of the tunable bandpass filter 10. The magnitude of the control signals to level shifting circuit 30 can be as low as LVCMOS levels (0 to about 3 volts), or could be as high as 8 volts for obtaining maximum linearity. In other words, the magnitude of the control signals can be tailored to fit the use.

The LVCMOS control signal input to level shifting circuit 30 is usually from about 0 volts (low) to about 3 volts (high). The level shifting circuit 30 can shift a control signal for the GaAs FET 15 as high as 8 volts. However, depending on the configuration of the comparator, any intermediate ON voltage level up to 8 volts, for example, can be selected. The switch "OFF" voltage is about 0 volts. For the switch "ON" voltage, linearity of the switch increases as the voltage level to the switch increases.

For the embodiments shown above, control signals to the level shifter are provided by a board resident LVCMOS compatible FPGA (field programmable gate array). A field programmable gate array is a type of integrated circuit. The FPGA provides the designer with the ability to custom program and reprogram the component function. As previously mentioned, predetermined tune settings are typically stored in a ROM (read only memory), and then recalled to tune the filter.

Those skilled in the art will appreciate that the operation of the tunable bandpass filter 10, as well as the system shown in the block diagram of FIG. 9 can be managed by one or more controllers of the SDR (not shown). For example, switches 57-1 and 57-2 can be simultaneously switched by the same controller.

The table in FIG. 10 compares linearity, size, power and selectivity of the GaAs FET tuned bandpass filter 10 against these same features in varactor and diode tuned bandpass filters. As shown in the table, the GaAs FET switch-tuned bandpass filter 10 is small in size, has excellent linearity, good selectivity and low power consumption. Additional discussion related to these is provided below.

Bandwidth and insertion loss of the tunable bandpass filter 10 can be controlled by varying the value of the coupling inductor 13. Insertion loss refers to the attenuation of the filter within its specified bandwidth. Insertion loss can also be described as the transmission loss measured in dB at that point in the passband that exhibits the minimum value. It is here noted that there is some insertion loss in the tunable bandpass filter 10 of the invention. However, the amount of insertion loss is tolerable in a filter used in a transmitter. While the filter may be used in a receiver, the amount of insertion loss would likely be contraindicative of any such suggestion.

Linearity of the GaAs FET switch-tuned filter 10 can be greatly influenced by the selection of the appropriate GaAs FET switches 15 themselves. The availability of integrated GaAs FET switches in small plastic packages contribute to making this filter realizable. In other words, the linearity of the filter can be determined by the linearity of the commercially available part selected, e.g., the Skyworks AS-211-334. For this GaAs FET switch, the datasheet indicates the OIP3 (output intercept point) is 43 dBm for 3V control logic and 50 dBm for 5V control logic. As the data sheet indicates, linearity is influenced by the voltage used to control the GaAS FET switch (linearity improves with higher voltage).

If minimum parts count is required, the GaAs FET switches 15 can be controlled directly by LVCMOS logic with some degradation in linearity. In such a case, the level shifting circuit 30 can be bypassed or simply not used. For maximum linearity performance (but additional parts count) voltage level shifting can be added.

With respect to space savings, the size of the filter is not affected significantly with level shifting circuitry added. For example, the GaAs FET switched filter is only about 0.870 in$^2$×0.070" high including the level shifting circuitry. These size dimensions are still notably smaller than size dimensions of a PIN diode switched filter, which is about 2.2 in$^2$×0.070" high. For a PIN diode switched circuit, the significantly greater size dimension is not attributable to the diode itself, in that there is no appreciable difference between the size of a GaAs FET and a PIN diode.

Rather, a greater space requirement for a PIN diode switched filter has more to do with the amount of the biasing circuitry required for each PIN diode. Particularly, each PIN diode requires an independent and complicated DC feed. For example, in the OFF state, each PIN diode must be reverse biased with a sufficiently high DC voltage (25 VDC max) to keep the diode OFF. In the ON state, each PIN diode must be forward biased with a significant DC current. Biasing circuitry for each PIN diode includes more than a dozen components, primarily including resistors and transistors. Further each DC biasing circuit must be RF bypassed with both inductors and capacitors, thereby further increasing the size of the PIN diode switched filter.

By contrast, the only add-on for the GaAs FET switched filter is the comparatively smaller level shifter. A filter having 10 PIN diodes, for example, would be much larger than a filter having 10 GaAs FETs.

Power consumption for the GaAs FET switch 15 is also quite low. For example, a single GaAs FET filter having 30-57 MHz frequency coverage, GaAs FET filter power, including level shifting circuitry, is only about 17 mW. By comparison, power consumption for a PIN diode filter is about 390 mW.

Selectivity (transmit selectivity) refers to a measure of the filter's ability to produce closely spaced frequencies without mutual interference. With respect to selectivity, selectivity of the tunable bandpass filter 10 with two coupled resonators (tuned portions) can be primarily determined by the coupling, and the measure of the sharpness of the resonance or frequency selectivity of a tuned circuit (Q or quality factor).

For a comparative discussion of selectivity, FIG. 10 shows that selectivity of GaAs FET switch-tuned bandpass filter is as good as a varactor tuned filter, while a PIN diode tuned filter has excellent selectivity. However, the GaAs switch-tuned bandpass filter 10 of the invention can obtain comparative selectivity with the PIN diode tuned filter by increasing the loaded Q ($Q_L$) of the resonator and changing the coupling (inductor value) to affect impedance in the filter.

To increase the $Q_L$ of the resonator while also preventing insertion loss of the filter, two switch legs can be placed in parallel (see FIG. 6). The lower resistance from the parallel switch leg arrangement increases the $Q_L$ of the resonator, and therefore increasing selectivity of the filter.

It will be understood that the present invention can be implemented in other communication devices, and is not restricted to use in handheld or manpack radios. For example, it is conceivable that the system can used in devices having form factors as small as or smaller than cellular phones or other handheld communications devices.

The spirit of the present invention is not limited to any embodiment described above. Rather, the details and features of an exemplary embodiment were disclosed as required. Without departing from the scope of this invention, other modifications will therefore be apparent to those skilled in the art. Thus, it must be understood that the detailed description of the invention and drawings were intended as illustrative only, and not by way of limitation.

We claim:

1. A tuning portion for tuning a circuit, the tuning portion comprising:
    a GaAs FET switch;
    a terminal to receive a control signal to turn the GaAs FET switch on or off;
    a first capacitor connected at a first signal terminal of said GaAs FET switch;
    a second capacitor connected between a second signal terminal of said GaAs FET switch and ground; and
    a termination capacitor coupled to a third signal terminal of the GaAs FET switch when said GaAs FET switch is switched to an off state.

2. The tuning portion of claim 1, wherein the control signal is a digital signal.

3. The tuning portion of claim 2, wherein the digital signal is level shifted.

4. A tuning portion for tuning a circuit, the tuning portion comprising:
    a GaAs FET switch comprising a control terminal and first, second and third signal terminals;
    said control terminal configured to receive a control signal to turn the GaAs FET switch on or off;
    a passive component connected at said second signal terminal of said GaAs FET switch and ground; and
    a termination capacitor coupled to said third signal terminal of the GaAs FET switch when the GaAs FET switch is switched to an off state.

* * * * *